United States Patent [19]

Monte et al.

[11] Patent Number: 5,062,469

[45] Date of Patent: * Nov. 5, 1991

[54] MOLD AND METHOD FOR CASTING A SINGLE CRYSTAL METAL ARTICLE

[75] Inventors: Louis H. Monte, Minerva; Arunachalam Jeyarajan, Euclid; Lawrence D. Graham, Chagrin Falls, all of Ohio

[73] Assignee: PCC Airfoils, Inc., Cleveland, Ohio

[*] Notice: The portion of the term of this patent subsequent to Jul. 10, 2007 has been disclaimed.

[21] Appl. No.: 542,436

[22] Filed: Jun. 22, 1990

Related U.S. Application Data

[63] Continuation-in-part of Ser. No. 382,729, Jul. 19, 1989, Pat. No. 4,940,073.

[51] Int. Cl.$^5$ ............................................. B22D 9/04
[52] U.S. Cl. ................................. 164/122.2; 164/361
[58] Field of Search .................. 164/122.1, 122.2, 361, 164/411

[56] References Cited

U.S. PATENT DOCUMENTS 3,542,120 11/1970 Piearcey .
4,180,119 12/1979 Burd et al. .
4,469,161 9/1984 Higginbotham et al. ............ 164/301
4,475,582 10/1984 Giamei et al. .
4,548,255 10/1985 Reiner et al. .
4,714,101 12/1987 Terkelsen .

FOREIGN PATENT DOCUMENTS 761050 11/1956 United Kingdom .

*Primary Examiner*—Kuang Y. Lin
*Attorney, Agent, or Firm*—Tarolli, Sundheim & Covell

[57] ABSTRACT

A mold is used to cast an article as a single crystal having selected primary and secondary orientations. The mold includes an article mold having a configuration corresponding to the configuration of the article to be cast. A starter section contains a starter cavity in which one or more crystals form. A seed crystal is disposed in the starter cavity. A crystal selector has a passage which extends between an upper end of the starter and a lower end of the article mold. To promote the growth in the crystal selector passage of a crystal having primary and secondary orientations corresponding to the selected primary and secondary orientations of the article, the longitudinal central axis of the crystal selector passage is disposed in a single plane which is parallel to a plane containing the selected primary orientation axis of the single crystal article and the selected secondary orientation axis of the single crystal article.

24 Claims, 6 Drawing Sheets

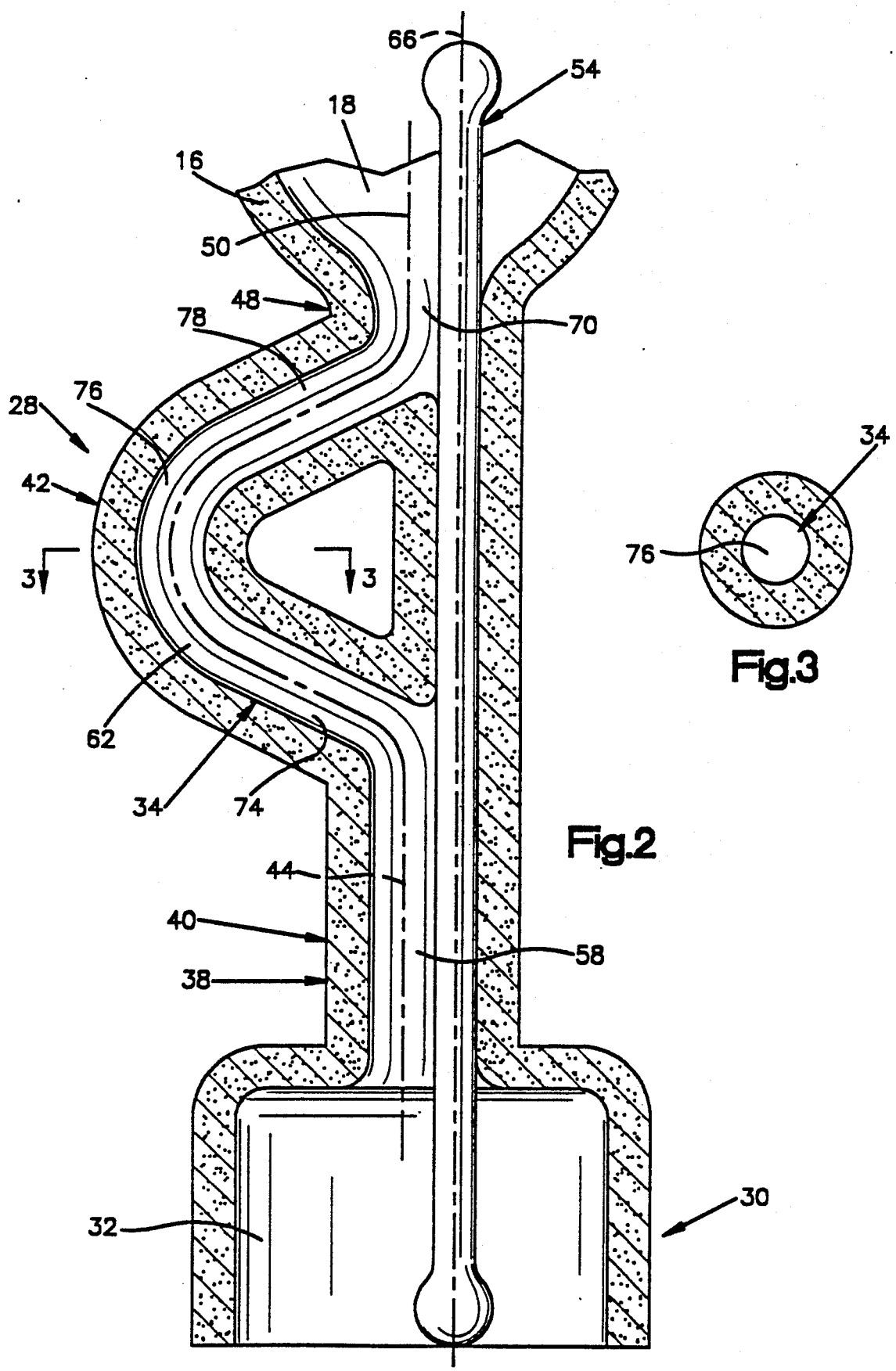

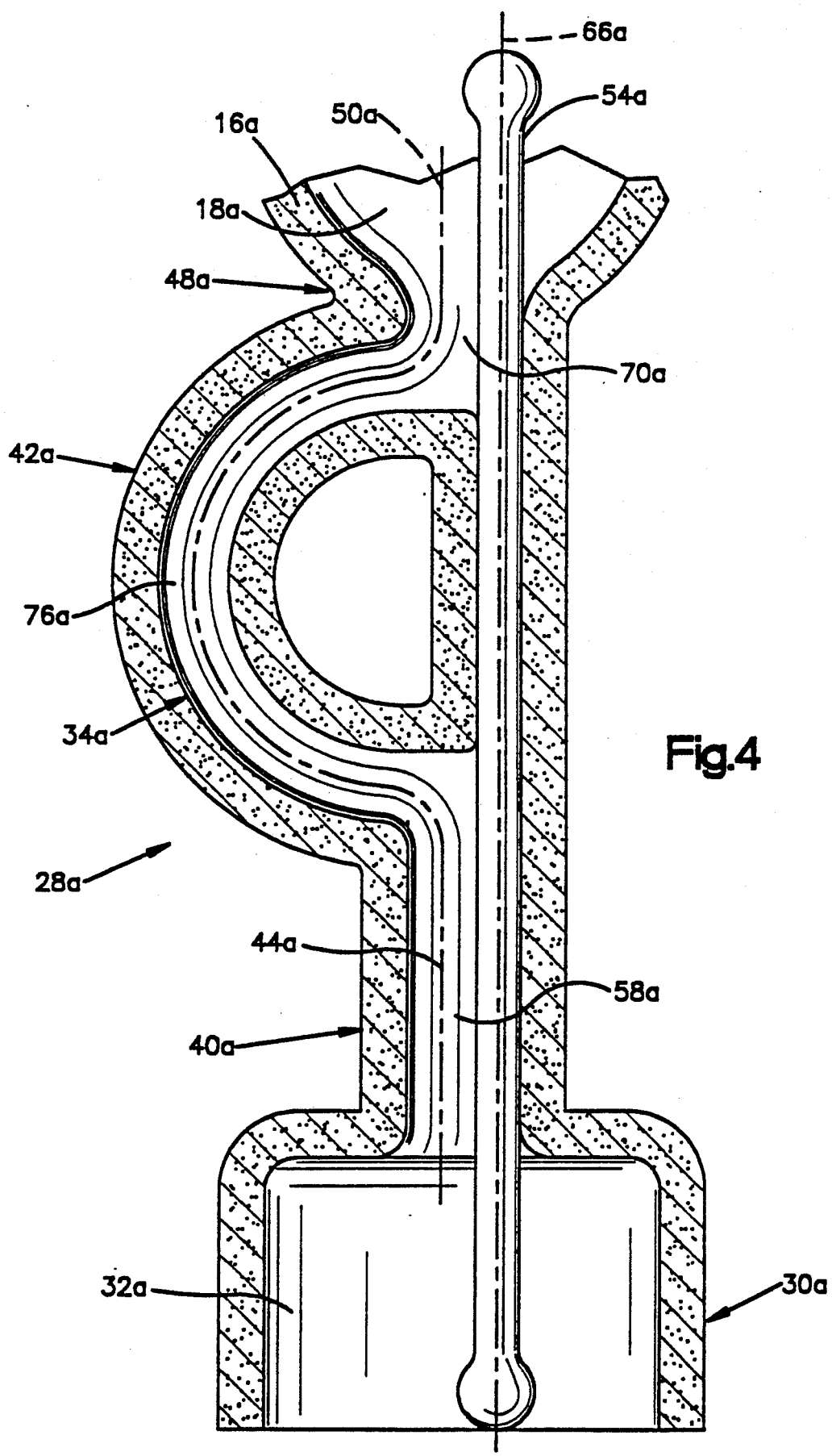

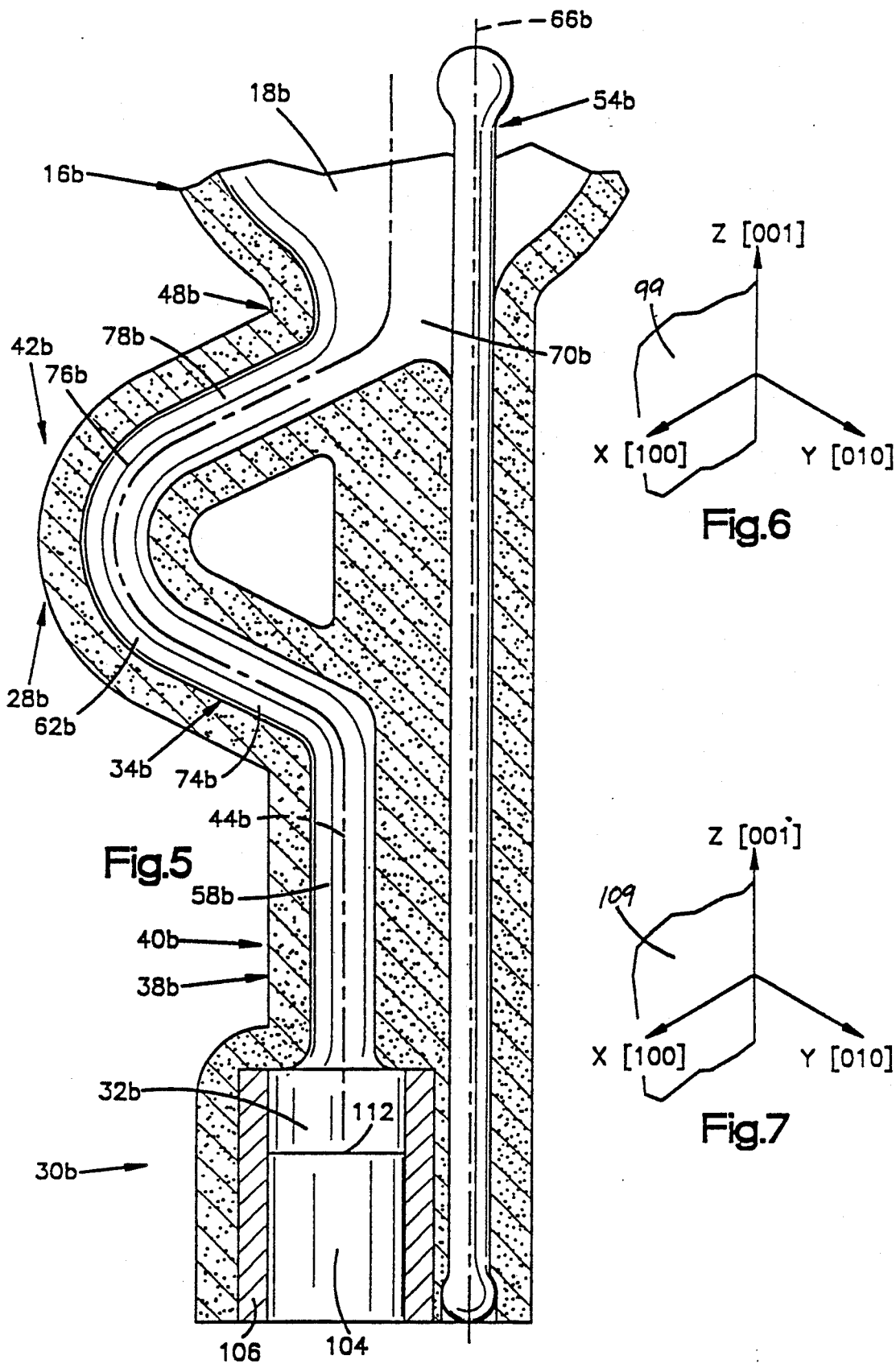

MOLD AND METHOD FOR CASTING A SINGLE CRYSTAL METAL ARTICLE

RELATED APPLICATION

This application is a continuation-in-part of U.S. patent application Ser. No. 07/382,729 filed July 19, 1989, now U.S. Pat. No. 4,940,073, and entitled "Mold for Casting a Single Crystal Metal Article". The benefit of the earlier filing date of application Ser. No. 07/382,729 for all common subject matter has been and hereby is claimed.

BACKGROUND OF THE INVENTION

The present invention relates to a mold and method which are used to cast a metal article as a single crystal.

Molds for casting single crystal metal articles have previously utilized helical crystal selectors of the so-called "pigtail" type. The casting of single crystal articles utilizing a helical selector is relatively expensive. This expense may be contributed to by a substantial scrap rate.

The molds for forming single crystal articles are commonly made by an investment or lost wax process. In this process of making a mold, a wax pattern is first formed. The wax pattern is covered with a layer of ceramic mold material. The wax pattern is removed from the layer of ceramic mold material to leave a space having a configuration corresponding to the configuration of the wax pattern. The forming of the wax pattern with a helical selector requires complicated tooling or injection mold in which the wax pattern of the helical selector is formed. Single crystal molds having a helical selector are disclosed in U.S. Pat. Nos. 4,475,582 and 4,548,255. A helical selector having a central support element is disclosed in U.S. Pat. No. 4,180,119.

It is frequently desired to cast a doubly oriented single crystal metal article. Thus, the operating characteristics of a single crystal metal article may be enhanced when the article has selected primary and secondary orientations. The primary orientation of single crystal article is along a primary or Z axis which corresponds to the [001] direction of crystal growth. The secondary orientation of the crystal may be along either an X or Y axis. The X axis corresponds to the [100] direction of crystal growth and the Y axis corresponds to the [010] direction of crystal growth.

It has previously been suggested that single crystal seeds having a known crystallographic orientation be used to cause molten metal to solidify as a cast article having a desired crystallographic orientation. When this is to be done, the seed crystal is accurately positioned with its primary and secondary orientations corresponding to the desired primary and secondary orientations of the article. Solidification of molten metal to form the article is initiated at the upper side surface of the seed. This may result in the growth of a single crystal having an orientation corresponding to the crystallographic orientation of the seed and the desired crystallographic orientation of the article.

Unfortunately, it is not uncommon for more than one crystal to be nucleated at or adjacent to the seed. Spurious or unwanted nucleation of secondary crystals may be caused by contaminants or other imperfections which occur during casting, particularly during casting on a production basis. The extra or secondary crystals will usually have a random crystallographic orientation which is almost always different than the desired crystallographic orientation of the article to be cast. Therefore, it is important that the secondary or spurious crystals do not grow into the article mold cavity.

If the secondary or spurious crystals grow into the article mold cavity, they can result in the formation of an article which is not a single crystal article. Thus, the secondary crystals can result in the formation of an article which is composed of two or more crystals having different crystallographic orientations. The secondary crystals can also result in the formation of an article having a crystallographic orientation which is different than the desired crystallographic orientation.

In order to enable articles to be cast with the desired primary and secondary crystallographic orientations, it has been suggested that a crystal selector be used in combination with a seed crystal. Thus, U.S. Pat. No. 4,714,101 discloses the use of a straight vertical crystal selector to block the growth of crystals nucleated along the sides of a seed from entering an article mold cavity. In addition, U.S. Pat. No. 4,475,582 discloses the use of a helical or "pigtail" type crystal selector in combination with a seed crystal.

SUMMARY OF THE INVENTION

A mold constructed in accordance with the present invention is used to cast a single crystal article having selected primary and secondary orientations. The mold has an improved crystal selector which promotes the emergence of a single crystal having the desired crystallographic orientation from a selector passage into an article mold cavity. The selector has a relatively simple construction which tends to minimize tooling costs. In addition, the simple construction of the selector minimizes the amount of relatively expensive metal which is used in the selector.

The improved crystal selector is used in conjunction with a single crystal seed which is disposed in a starter cavity and has primary and secondary orientation axes parallel to selected primary and secondary orientation axes of the single crystal article. Although it is desired to initiate the solidification of only a single crystal of metal from a surface of a single crystal seed during a casting operation, a plurality of crystals may be nucleated in the starter cavity, particularly during production casting operations. Among the plurality of crystals will be a main crystal which is formed from the surface of the single crystal seed with primary and secondary orientation axes parallel to the selected primary and secondary orientation axes of the single crystal article to be cast. Unwanted additional or secondary crystals which are nucleated in the starter cavity may have a random crystallographic orientation. In all probability, the random crystallographic orientation of these unwanted crystals will differ from the selected crystallographic orientation of the article to be cast.

To enable only the main crystal having the desired crystallographic orientation to grow from the starter cavity to the article mold cavity, an improved crystal selector is used in combination with the seed crystal. The crystal selector has a selector passage with a longitudinal axis which extends transversely to a vertical central axis of the starter cavity for at least a portion of the length of the passage. The longitudinal axis of the selector passage is disposed in a single plane which is parallel to a plane containing the selected primary orientation axis of the single crystal article and the selected secondary orientation axis of the single crystal article.

Therefore, the single crystal selector passage is constructed in such a manner as to promote the growth of only a crystal which has a crystallographic orientation corresponding to the selected crystallographic orientation of the article to be cast.

Accordingly, it is an object of this invention to provide a new and improved mold and method for use in casting a single crystal metal article and wherein an improved crystal selector is used in combination with a seed crystal to cast a single crystal article having selected primary and secondary orientations.

Another object of this invention is to provide a new and improved mold and method in accordance with the preceding object and wherein the single crystal selector has a selector passage with a longitudinal central axis which is disposed in a plane parallel to a plane containing the selected primary orientation axis of the single crystal article and the selected secondary orientation axis of the single crystal article.

BRIEF DESCRIPTION OF THE DRAWINGS

The foregoing and other objects and features of the present invention will become more apparent upon a consideration of the following description taken in connection with the accompanying drawings, wherein:

FIG. 2 is an enlarged sectional view of a single crystal selector used in the mold structure of FIG. 1;

FIG. 3 is a sectional view, taken generally along the line 3—3 of FIG. 2, illustrating the cross sectional configuration of a bend portion of a passage in the single crystal selector;

FIG. 4 is an enlarged sectional view, generally similar to FIG. 2, of a second embodiment of the crystal selector;

FIG. 5 is an enlarged sectional view of a single crystal selector and a seed crystal which may be used in a mold structure similar to the mold structure of FIG. 1 to cast a single crystal article having selected primary and secondary orientations;

FIG. 6 is a schematic illustration depicting the selected primary and secondary crystallographic orientations for an article to be cast in an article mold cavity with the selector and single crystal seed of FIG. 5;

FIG. 7 is a schematic illustration depicting the primary and secondary crystallographic orientations for the seed crystal used with the selector of FIG. 5;

DESCRIPTION OF SPECIFIC PREFERRED EMBODIMENTS OF THE INVENTION

Mold Structure

Figure 1:
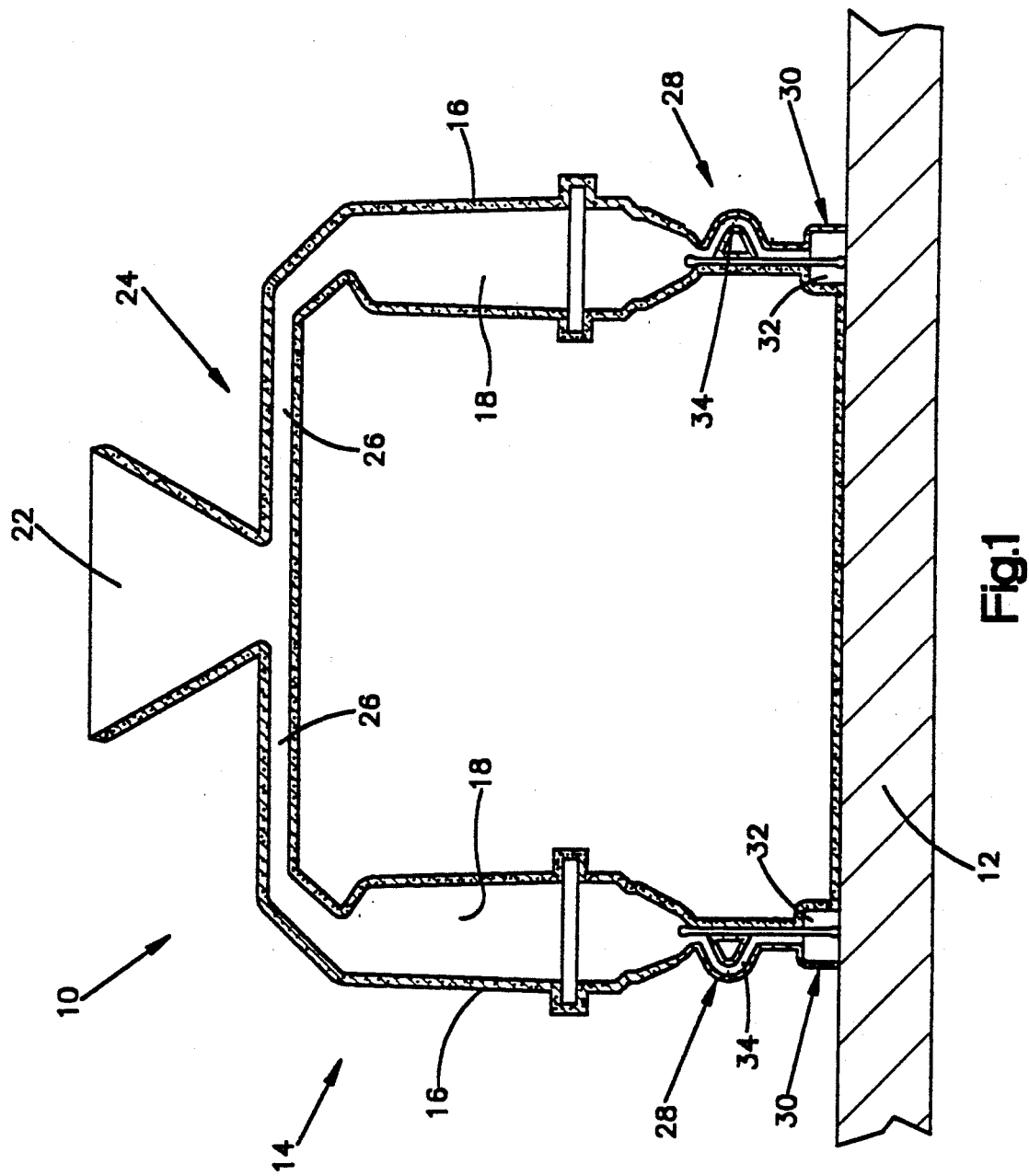
FIG. 1 is a schematic illustration depicting the manner in which a mold structure is supported on a chill plate prior to pouring of molten metal in the mold structure.

A mold structure 10 constructed in accordance with the present invention is illustrated in FIG. 1 on a chill plate 12. The mold structure 10 includes an annular array 14 of article molds 16. The article molds 16 have mold cavities 18 with configurations corresponding to the configuration of single crystal articles to be cast in the mold structure 10. It should be understood that although only a pair of article molds 16 have been illustrated in FIG. 1, the mold structure 10 includes additional article molds which have not been illustrated but which each have the same construction as the illustrated article molds.

Molten metal is conducted from a pour cup 22 to the article mold cavities 18 through a gating system 24. The gating system 24 includes a plurality of passages or runners 26 which extend outwardly from the bottom of the pour cup 22 to the upper end portions of the article mold cavities 18. The molten metal flows downwardly through the article mold cavities 18 and through a single crystal selector 28 to a starter 30.

In the embodiment of the invention illustrated in FIGS. 2 and 3, the starter 30 includes a generally cylindrical starter cavity 32 having an open lower end which is blocked by the chill plate 12. The molten metal solidifies in the starter cavity 32 of FIG. 2 as a plurality of elongated grains or crystals which extend upwardly from the chill plate 12 to the upper end of the starter cavity. A few of the grains of metal grow from the starter cavity 32 into a crystal selector passage 34 in the single crystal selector 28.

As the few grains which enter the crystal selector passage 34 continue to grow, the most favorably oriented grain or crystal grows at a greater rate than the other grains or crystals. Therefore, the most favorably oriented grain or crystal crowds out the less favorably oriented grains. This results in the single grain or crystal which is most favorably oriented growing from the crystal selector passage 34 into the article mold cavity 18.

The single grain or crystal which emerges from the crystal selector passage 34 into the article mold cavity 18 solidifies to completely fill the article mold cavity. The single crystal of metal which solidifies in the article mold cavity 18 has a configuration which corresponds to a desired configuration of the article to be cast. The molten metal in the gating system 24 then solidifies. During solidification of the molten metal in the gating system, additional crystals may nucleate.

The one-piece mold structure 10 is formed of a ceramic material by what is frequently referred to as the lost wax process. In making the mold structure 10, a disposable pattern is first formed. The disposable pattern has the same configuration as the interior of the mold structure 10. Thus, main portions of the disposable pattern have a configuration corresponding to the configuration of the article mold cavity 18. Other portions of the disposable pattern have configurations corresponding to the configuration of the starter cavity 32, the selector passage 34 and the gating system 24.

The specific configuration of the disposable pattern will depend upon the configuration of the article to be cast and the gating associated with the article. The disposable pattern may be formed of a natural or artificial wax, polystyrene or other material.

A wet coating of ceramic mold material is applied over the disposable pattern. The wet coating of ceramic mold material may be applied over the pattern by dipping, brushing, spraying or other methods. However, it is presently preferred to repetitively dip the pattern in a liquid slurry of ceramic mold material. Although many different types of slurry could be utilized, one illustrative slurry contains fused silica, zircon, or other refractory materials in combination with binders. A chemical binder such as ethyl silicate, sodium silicate and colloidal silica can be used. In addition, the slurry may contain suitable film formers, such as alginates, to control viscosity and wetting agents to control flow characteristics and pattern wetability.

In accordance with common practices, the initial slurry coating applied to the pattern may contain a very finely divided refractory material to produce an accurate surface finish. A typical slurry for a first coat may contain colloidal silica sol as the binder. Zircon or alumina of a particle size of 325 mesh or smaller as the refractory can be employed, together with less than one-tenth percent by weight of a wetting agent. After the application of the initial coating, the surface is stuccoed with refractory materials having particle sizes on the order of 60 to 200 mesh.

In accordance with well known procedures, each dip coating is dried in air at a temperature of approximately 24° C. before subsequent dipping. The pattern is repetitively dipped and dried enough times to build up a covering of a ceramic mold material of a desired thickness. For example, the pattern may be dipped fifteen times to build up a covering of a thickness of approximately 0.400 inches in order to prevent mold bulge.

The wax material of the pattern is then melted and removed from the mold. After dewaxing, the uncured mold structure is fired in an oxidizing atmosphere at a temperature of more than 540° C. for one hour to thoroughly cure the mold sections, burn any residual pattern material, and drive off any water. It is comtemplated that the uncured mold sections may be fired in an oxidizing atmosphere at a temperature of approximately 1,038° C. for approximately one hour. Of course, the specific composition of the slurry of ceramic mold material, number of dip coatings, and firing temperature and time may vary depending upon the construction of the mold.

Single Crystal Selector

The single crystal selector 28 has a one-piece ceramic wall, generally designated with the numeral 38 in FIG. 2, which is integrally formed with the starter 30 and article mold 16. The wall 38 is formed in the manner previously explained by covering a disposable crystal selector pattern with ceramic mold material.

The crystal selector 28 includes a lower section 40 which extends upwardly from the starter 30. The crystal selector 28 has a single bend section 42 which extends sidewardly and upwardly, first away from and then back toward a vertical axis 44 of the lower section 40. An upper section 48 extends upwardly from the single bend section 42. The upper section 48 is vertically aligned with the lower section 40 and is connected with the article mold wall 16. The upper section 48 has a vertical axis 50 which is coincident with the vertical axis 44 of the lower section 40.

A support element 54 extends straight upwardly from the lower section 40 to the upper section 48. The vertical support element 54 spans the space between opposite ends of the single bend section 42 to support the single bend section against the influence of vertical and/or sideward loading. The support element 54 is a cylindrical quartz rod. The cylindrical surface of the linear fused quartz rod has been roughened to promote adherence of the ceramic mold material to the quartz rod. In addition, beads or bulges are formed at opposite ends of the support element 54 to promote the adherence of wax pattern material to the support element during forming of the mold 10. If desired, the support element 54 could be made of a material other than fused quartz, for example, a suitable ceramic material.

The crystal selector passage 34 includes a linear, generally cylindrical, lower portion 58 with a vertical central axis 44. A lower end of the portion 58 of the selector passage 34 opens into the top of the starter cavity 32 at a location on the vertical central axis of the cylindrical starter cavity. The opposite or upper end of the straight lower portion 58 of the selector passage 34 opens into a single bend portion 62 of the selector passage.

Although a majority of the surface area of the vertical lower portion 58 of the selector passage 34 is formed by ceramic mold material, a vertical segment of the side surface of the support element 54 is exposed to the interior of the lower portion of the selector passage. Therefore, the surface of support element 54 forms a vertically extending part of the side wall of the lower portion of the selector passage. The support element 54 has a vertical central axis 66 which extends parallel to and is offset to one side of the central axis 44 of the lower portion 58 of the selector passage 34. The support element 54 has a circular cross section with the same diameter as a circular cross section of the lower portion 58 of the selector passage 34.

The single bend portion 62 of the selector passage 34 has a lower end which opens into the top of the lower portion 58 of the selector passage and an upper end which opens into an upper portion 70 of the selector passage 34. The single bend portion 62 of the selector passage 34 has an upwardly and outwardly inclined entrance ramp 74 which extends from the lower portion 58 of the selector passage to a single arcuate bend 76. The entrance ramp 74 is straight and is disposed in a plane containing the vertical central axis 44 of the lower portion 58 of the selector passage and the vertical central axis 66 of the support rod 54.

The single arcuate bend 76 of the selector passage 34 is formed as a portion of a circle and connects the entrance ramp 74 with a linear exit ramp 78. The arcuately curving central axis of the single bend 76 of the selector passage 34 is disposed in the same flat plane as the central axis of the entrance ramp 74, the central axis 44 of the lower section 40 and the central axis 66 of the support rod 54. The single arcuate bend 76 has a circular cross sectional configuration (FIG. 3) of the same diameter as the circular cross section of the entrance ramp 74. However, if desired, the diameter of the selector passage 34 can vary along its entire length.

The upwardly and inwardly inclined exit ramp 78 (FIG. 2) of the selector passage 34 has a lower end which is connected with the single arcuate bend 76 of the selector passage. An upper end of the straight exit ramp 78 of the selector passage 34 is connected with the upper end portion 70 of the selector passage. The exit ramp 78 of the selector passage 34 has a central axis which is disposed in the same flat plane as the central axis of the single bend 76, entrance ramp 74 and lower portion 58 of the selector passage. The exit ramp 78 of the selector passage 34 has a circular cross sectional configuration of the same diameter as the circular cross section of the arcuate bend 76.

The linear upper portion 70 of the selector passage 34 has a lower end which opens into the exit ramp 78 of the selector passage 34. A circular opening at an upper end of the upper portion 70 of the selector passage 34 opens into the article mold cavity 18. The vertical central axis 50 of the upper portion 70 of the selector passage 34 is disposed in the same flat plane as the central axis of the exit ramp 78, single arcuate bend 76, entrance ramp 74, and lower portion 58 of the selector passage 34. Since the vertical central axis 50 of the upper portion 70 of the selector passage 34 is coincident with the vertical axis 44 of the lower portion 58 of the selector passage, the axis 50 of the upper portion 70 of the selector passage extends parallel to and is offset to one side of the central axis 66 of the support element 54.

Although a majority of the surface area of the vertical upper portion 70 of the selector passage 34 is formed by ceramic mold material, a vertical segment of the side surface of the support element 54 is exposed to the interior of the upper portion of the selector passage. Therefore, the surface of the support element 54 forms a vertically extending part of the side wall of the upper portion of the selector passage. The vertical central axis 76 of the support element 54 extends parallel to and is offset to one side of the central axis 50 of the upper portion 70 of the selector passage 34. The support element 54 has a circular cross section with the same diameter as the circular cross section of the upper portion 70 of the selector passage 58. However, the diameter of the support element 54 could be different than the diameter of the selector passage.

Although the support element 54 is exposed to the interiors of the upper and lower portions 70 and 58 of the selector passage 38, the portion of the support element 54 disposed between opposite ends of the single bend portion 62 of the selector passage 34 is completely enclosed by the ceramic mold material. This enables the support element 54 to strengthen the single bend section 42 of the selector 28 against the influence of vertical and/or sideward loads.

The simplicity of construction of the selector passage 34 is promoted by the fact that the single arcuate bend 76 of the selector passage 34 has a central axis which is disposed in the same flat plane as the central axes 44 and 50 of the lower portion 58 and upper portion 70 of the selector passage. In addition, the selector passage 34 has the same circular cross sectional configuration throughout its length. This simplifies tooling for the formation of a mold into which wax pattern material is injected during the forming of the single crystal selector 28.

The selector passage 34 has a substantially uniform circular cross sectional configuration throughout its length with a diameter of less than 0.25 inches. The single arcuate bend 76 is offset from the central axes 44 and 50 of the lower and upper vertical portions 58 and 70 of the selector passage by a distance which is at least 1.5 times the diameter of the single arcuate bend 76 of the selector passage. Thus, the maximum horizontal distance from the center line of the single arcuate bend 76 to the line of the coincident vertical axes 44 and 50 is at least 1.5 times the diameter of the arcuate bend 76 of the selector passage.

In the crystal selector 28 illustrated in FIG. 2, a support element 54 extends downwardly from the crystal selector 28 to the bottom of the starter 30 to enable the support rod 54 to engage the chill plate 12. The opposite end of the support rod 54 extends into the article mold cavity 18. This enables the support rod to transmit force from the article mold 16 directly to the chill plate 12 without applying a load to the single crystal selector 28. However, if desired, the support element 54 could have a lower end portion which is disposed above the starter 30 and an upper end portion which is disposed below the article mold cavity 18.

It is contemplated that certain embodiments of the crystal selector 28 may not require the support rod 54. These embodiments of the crystal selector will be constructed so that both the wax pattern of the selector and the selector itself can withstand normal vertical and/or sideward loads.

Casting Article

When the ceramic mold structure 10 is to be used to cast single crystal articles, such as turbine blades, the chill plate 12 (FIG. 1) is lowered and the mold structure is positioned on the chill plate. The chill plate 12 is then raised to position the mold structure in a cylindrical furnance chamber (not shown). A housing enclosing the furnace chamber is then evacuated to provide a nonoxidizing atmosphere.

After the furnace chamber has been evacuated, the mold structure 10 is preheated to a temperature above the liquidius temperature of the metal to be cast. Although the preheat temperature will vary depending upon the composition of the metal alloy to be cast, it is contemplated that the preheat temperature may be approximately 1,500° C. A flow of molten metal is then conducted into the pour cup 22. The metal flows downwardly through the article mold cavities 18 into the crystal selector 28. The molten metal may be a nickel chrome super alloy.

After the mold structure 10 has been filled with molten metal, the chill plate 12 is slowly lowered and the mold is withdrawn from the furnace chamber. Molten metal in each of the starter cavities 34 solidifies as a plurality of elongated and vertically upwardly extending grains. As the mold structure 10 is gradually withdrawn from the furnace chamber, a plurality of grains grow from the starter cavity 32 (FIG. 2) upwardly into the lower portion 58 of the selector passage 34. As the molten metal solidifies in the lower portion 58 of the selector passage 34, the grains which are most favorably oriented for vertical growth tend to crowd out the grains which are less favorably oriented.

Continued solidification of the molten metal in the selector passage 34 results in the grains growing into the upwardly and outwardly inclined entrance ramp 74 of the crystal selector passage 34. As the molten metal solidifies along the entrance ramp 74, the grain or grains which are most favorably oriented for sideward growth, that is toward the left (as viewed in FIG. 2), crowd out the less favorably oriented grains. As the molten metal solidifies in the arcuate bend 76 of the selector passage, the most favorably oriented grain will probably crowd out or will have crowded out any other grain or grains.

As the solidification of the molten metal continues from the arcuate bend 76 of the selector passage 34 and to the upwardly and rightwardly (as viewed in FIG. 2) sloping exit ramp 78 of the selector passage, the single most favorably oriented grain will probably solidify as a single crystal in the exit ramp of the selector passage. However, if there should be an additional grain, it will be crowded out by the most favorably oriented grain as the molten metal in the exit ramp 78 of the selector passage solidifies.

Finally, the molten metal in the vertical upper portion 70 of the selector passage will solidify. The vertical portion 70 of the selector passage is provided in order to be certain that the most favorably oriented grain has crowded out all other grains. Thus, it is contemplated that the molten metal in the upper portion 70 of the selector passage 34 will solidify as a single crystal. However, if a second grain should grow into the upper portion 70 of the selector passage 34, an additional opportunity is provided for the most favorably oriented grain to crowd out the second or less favorably oriented grain. Therefore, a single crystal will grow from the upper portion 70 of the selector passage 34 into the article mold cavity 18. This single crystal expands in the article mold cavity 18 and solidifies with a configuration which corresponds to the configuration of the article to be cast.

The single crystal of metal grows upwardly in the article mold cavity 18 to the gating system 24. In the gating system 24, there may be spurious nucleation with a few additional crystals so that the single crystal structure of the solidifying molten metal may end at a location past the upper end of the article mold cavity 18, that is in the gating system 24.

Although it is preferred to withdraw the mold structure 10 from the furnace to cause a generally horizontal solidification zone to move upwardly from the lower end portion of the mold structure to the upper end portion of the mold structure, the mold structure could be maintained stationary in the furnace chamber. If this were done, a plurality of separate coils could be used in the manner disclosed in U.S. Pat. Nos. 3,346,039; 3,376,915; and 3,405,220. The electrical energy to the lower coils would be gradually reduced and terminated to cause the horizontal solidification zone to move slowly upwardly through the stationary article mold cavity 18.

In one specific embodiment of the single crystal selector 28, the distance from the lower end of the article mold cavity 18 to the lower end of the starter 30 was 2.15 inches. The starter cavity 32 has a height of 0.5 inches and a diameter of 0.75 inches. The lower portion 58 of the selector passage 34 had a height of 0.65 inches. The entrance and exit ramps 74 and 78 each had a length of 0.4 inches. The single arcuate bend 76 in the selector passage had a center line radius of approximately 0.15 inches.

In this specific embodiment of the crystal selector 28, the distance between opposite ends of the entrance and exit ramps 74 and 78 of the selector passage 34 was 0.65 inches. The upper section 48 of the selector passage had a vertical height of 0.25 inches. The selector passage 34 had a circular cross section with a diameter of 0.10 inches. The horizontal distance from the central axes 44 and 50 of the upper and lower portions 58 and 70 of the selector passage to the furthermost point on the center line of the single arcuate bend 76 was 0.5 inches.

The foregoing specific dimensions for the selector passage 34 were obtained by measuring a wax pattern for a specific selector. It should be understood that the foregoing dimensions have been set forth merely for purposes of illustration and not for purposes of limiting the invention. It is contemplated that the dimensions of single crystal selectors constructed in accordance with the present invention will have dimensions which are different than these specific dimensions.

The crystal selector for which the dimensions have been set forth above had a support rod or element 54 with a diameter of 0.1 inches. The support element had an overall length of 2.4 inches.

It should be understood that the foregoing dimensions of the support element, like the other dimensions of the selector, have been set forth for purposes of clarity of illustration and it is not intended that the invention be limited to any particular dimensions. In fact, it is contemplated that the support element 54 could be omitted if desired. Thus, if the selector and its wax pattern are capable of withstanding the vertical and/or sideward loading to which they are subjected, the support element could be eliminated. However, it is preferred to use the support element in order to stabilize the selector and the wax pattern for the selector and to minimize breakage and/or deformation of the selector and/or wax pattern of the selector during handling, the forming of the mold structure 10, and the casting of an article.

Single Crystal Selector

Second Embodiment

In the embodiment of the invention illustrated in FIGS. 1-3, the single crystal selector 28 has a selector passage 34 with linear entrance and exit ramps 74 and 78 leading to and from a single arcuate bend 62. In the embodiment of the invention illustrated in FIG. 4, the selector passage has a single continuously curving arcuate bend which interconnects lower and upper portions of the selector passage. Since the embodiment of the invention illustrated in FIG. 4 is generally similar to the embodiment of the invention illustrated in FIGS. 1-3, similar numerals will be utilized to designate similar components, the suffix letter "a" being added to the numerals of FIG. 4 to avoid confusion.

The single crystal selector 28a (FIG. 4) has a lower section 40a which extends upwardly from a starter 30a. A single bend section 42a extends sidewardly and upwardly first away from the vertical lower section 40a and then back toward the longitudinal central axis 44a of the lower section 40a. A vertical upper section 48a extends upwardly from the single bend section 42a and is connected to the article mold 16a. The upper section 48a is vertically aligned with the lower section 40a.

A straight cylindrical support element 54a extends upwardly from the lower section 40a to the upper section 48a. The support element 54a spans the space between opposite ends of the single bend section 42a of the selector 28a. The support element 54a is a cylindrical fused quartz rod and has an outer side surface which has been roughened to facilitate the adherence of ceramic mold material to the surface of the support element. The rod also has beads on both ends for added adherence.

A selector passage 34a is disposed within the single crystal selector 28a and interconnects the starter cavity 32a and article mold cavity 18a. The crystal selector passage 34a includes a linear vertical, lower portion 58a. The cylindrical lower portion 58a of the selector passage 34a has a lower end which opens into the top of the starter cavity 32a and an upper end which opens into a continuously curving bend 76a of the selector passage 34a. A relatively small percentage of the surface area of the lower portion 58a of the selector passage 34a is formed by the outer side surface of the support element 54a. The vertical axis 44a of the lower portion 58a of the selector passage 34a is parallel to and offset to one side of the vertical central axis 66a of the support element 54a.

The single bend 76a of the selector passage 34a continuously curves from a lower end portion which is connected with the lower portion 58a of the selector passage 34a to an upper end portion which is connected with the upper portion 70a of the selector passage. The continuously curving configuration of the single bend portions 76a results in the single bend portion having a generally "C" shaped configuration. Thus, the arcuate bend portion 76a of the selector passage 34a has a generally semicircular configuration.

The cylindrical upper portion 70a has a lower end which opens to the upper end of the continuous arcuate bend 76a and an upper end which opens to the article mold cavity 18a. A relatively small vertical segment of the surface area of the upper portion 70a of the selector passage 34a is formed by the outer side surfaces of the support element 54a. The vertical axis 50a of the upper portion 70a is coincident with the vertical axis 44a of the lower portion 58a of the passage 34a.

The central axis of the continuously curving single bend 76a of the crystal selector passage 34a is disposed in the same plane as the coincident vertical axes 44a and 50a of the lower and upper portions 58a and 70a of the selector passage. The vertical axis 66a of the support element 54a is disposed in the same plane as the central axes of the lower portion 58a, continuous bend 76a and upper portion 70a of the selector passage 34a.

The selector passage 34a has a circular configuration throughout its length with a diameter of less than 0.25 inches. The distance, measured on a horizontal plane, from the coincident vertical axes 44a and 50a of the lower and upper portions 58a and 70a of the selector passage 34a to the furthermost point on the central axis of the continuously curving bent 76a of the selector passage, that is as measured on the horizontal plane extending through the center of curvature of the continuously curving bend 76a, is at least 1.5 times the cross sectional diameter of the selector passage 34a.

During casting of molten metal in the mold structure of which the selector 28a is a part, the molten metal solidifies in the same manner as previously described in connection with the embodiment of the invention shown in FIGS. 1-3. Thus, a plurality of elongated upwardly extending crystals initially solidify in the cylindrical starter cavity 32a. A few of these crystals grow upwardly into the lower portion 58a of the selector passage 34a. As the crystals grow upwardly in the lower portion 58a of the selector passage 34a, the most favorably oriented crystals tend to crowd the less favorably oriented crystals. The molten metal then solidifies upwardly along the continuously curving bend 76a of the selector passage 34a. As this occurs, the crystal which is most favorably oriented for upward and sideward growth crowds the other crystals. Therefore, only one crystal emerges from the upper portion 70a of the selector passage 34a and grows into the article mold cavity 18a.

The dimensions of the single crystal selector 28a may be generally the same as the dimensions of the single crystal selector 28 of FIG. 3. In this specific embodiment, the single crystal selector 28a would have an overall height of 2.15 inches. The selector passage 34a would have a cross sectional diameter of 0.10 inches. The distance from the line of coincident vertical axes 44a and 50a of the lower and upper portions 58a and 70a of the selector passage 34a to the outermost point on the central axis of the continuously curving single bend portion 76a of the selector passage would be 0.5 inches. Of course, the dimensions of different embodiments of the crystal selector 28a could be different than the foregoing dimensions. For example, one specific embodiment of the selector 28a has an overall height of 2.7 inches.

Mold Structure for Doubly Oriented Single Crystal Article

When the single crystal selectors 28 and 28a illustrated in FIGS. 2-4 are used, there is some tendency for the cast single crystal articles to have a secondary orientation axis, corresponding to the [100] growth direction, disposed in a plane which contains the longitudinal central axis of the selector passage 34. This is because a crystal having this orientation will be most favorably oriented for growth along portions of the selector passage 34 which extend transversely to a vertical central axis of the starter cavity 32. However, due to the nucleation of a relatively large number of single crystals which are randomly oriented in the starter cavity 32, many of the articles cast in the article mold cavities 18 and 18a will have crystallographic orientations in which a secondary orientation axis is not disposed in a plane which contains the longitudinal central axis 44 of the selector passage 34. In the embodiment of the invention illustrated in FIGS. 5-8, a mold is provided to cast an article as a single crystal with selected primary and secondary orientations, that is, a doubly oriented single crystal article.

In order to obtain the selected primary and secondary orientations of the cast article, the mold of FIGS. 5-8 utilizes a single crystal seed in association with the crystal selector illustrated in FIGS. 2 and 3. Since components of the embodiment of the invention illustrated in FIGS. 5-8 are generally similar to components of the invention illustrated in FIGS. 2 and 3, similar numerals will be utilized to designate similar components, the suffix letter "b" being associated with the numerals of FIGS. 5-8 to avoid confusion.

An article mold 16b (FIG. 5) is used in a mold structure having the same general construction as the mold structure of FIG. 1. The article mold 16b includes an article mold cavity 18b which is connected in fluid communication with a single crystal selector 28b and a starter 30b. The article mold 16b is formed of ceramic mold material in the manner previously explained in conjunction with the embodiment of the invention illustrated in FIGS. 1-3.

The article mold cavity 18b (FIG. 5) is used to cast a metal article as a single crystal having selected primary and secondary orientations. The selected primary orientation axis of the single crystal article has been designated as the Z axis in FIG. 6 and corresponds to the [001] direction of crystal growth. The Z axis is a vertical axis.

The selected secondary orientation axis of the single crystal article has been designated as the X axis in FIG. 6 and corresponds to the [100] direction of crystal growth. The X axis is perpendicular to the primary or Z axis. The selected secondary or X axis is also perpendicular to a second secondary or Y axis which corresponds to the [010] direction of crystal growth. The X and Y axes are disposed in a horizontal plane.

The selected primary orientation or Z axis and the selected secondary orientation or X axis are disposed in a vertical plane 99 (FIG. 6). The primary and secondary crystallographic orientations of the article cast in the mold cavity 18$b$ (FIG. 5) are disposed relative to features of the single crystal article in such a manner as to enhance the operating characteristics of the article. Of course, if desired, the Y axis could be the selected secondary axis.

The starter 30$b$ defines a starter cavity 32$b$ in which solidification of molten metal is initiated as one or more single crystals. A cylindrical single crystal metal seed 104 is disposed in a cylindrical retainer or holder 106. The holder 106 holds the seed 104 with a primary orientation axis parallel to the selected primary orientation axis of the single crystal article and with a secondary orientation axis parallel to the selected secondary orientation axis of the single crystal article. The seed 104 is formed of a metal similar to the metal to be cast in the article mold cavity 18$b$.

The holder 106 holds the single crystal metal seed 104 with a primary orientation axis, designated Z in FIG. 7 and corresponding to the [001] direction of crystal growth, extending vertically. The secondary orientation or X axis of the 104 seed corresponds to the [100] direction of crystal growth and extends perpendicular to both the Z axis and to a second secondary or Y axis. The Y axis corresponds to the [010] direction of crystal growth. The X and Y axes (FIG. 7) are disposed in a horizontal plane.

The primary and secondary orientation or Z and X axes of the single crystal seed 104 are disposed in a vertical plane 109 (FIG. 7). The plane 110 extends parallel to the vertical plane 99 (FIG. 6) in which the primary and secondary orientation or Z and X axes for the cast article are disposed. Thus, the primary orientation or Z axis of the single crystal seed 104 is parallel to the selected primary orientation or Z axis of the cast article. Similarly, the secondary orientation or X axis of the seed 104 is parallel to the selected secondary orientation or X axis of the single crystal article. In the illustrated embodiment of the article mold 16$b$, the planes 99 and 110 are coincident. However, the planes could be offset relative to each other if desired.

The selector 28$b$ (FIG. 5) allows only a single crystal of metal to grow from the starter cavity 32$b$ into the article mold cavity 18$b$. Although it is desired to have only one crystal nucleate at the circular upper side surface 112 of the seed 104, during casting on a production basis, more than one crystal frequently nucleates in the starter cavity 32$b$. Since only a main crystal which nucleates at the surface 112 of the seed 104 will probably have the desired crystallographic orientation, the other crystals which nucleate in the starter cavity 32$b$ are blocked from growing into the article mold cavity 18$b$ by the selector 28$b$.

The single crystal selector 28$b$ (FIG. 5) makes certain that the single crystal of metal which grows from the starter cavity 32$b$ through the crystal selector to the article mold cavity 18$b$ has the desired primary and secondary crystallographic orientations which correspond to the crystallographic orientation of the seed 104 and selected crystallographic orientation of the article to be cast in the mold 18$b$. The crystal selector 28$b$ has a selector passage 74$b$ with a longitudinal central axis 44$b$ which extends transversely to a vertical central axis of the starter cavity 32$b$ for a major portion of the length of the crystal selector 28$b$. The longitudinal axis 44$b$ of the crystal selector passage 74$b$ is disposed in a single plane parallel to a plane containing both the primary and secondary orientation axes of the single crystal article.

Figure 8:
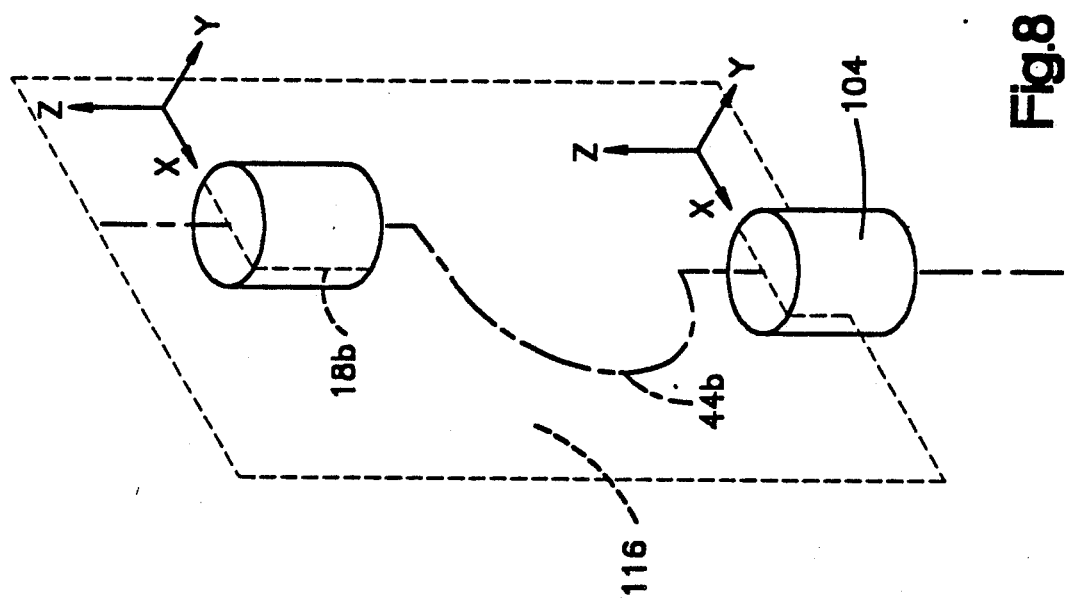
FIG. 8 is a schematic illustration depicting the manner in which a longitudinal central axis of a selector passage in the crystal selector of FIG. 5 is disposed in a single plane which is parallel to planes containing primary and secondary orientation axes of the seed crystal and an article to be cast.

The manner in which the longitudinal central axis 44$b$ of the selector passage 74$b$ is disposed in a single plane is illustrated schematically in FIG. 8. Thus, the longitudinal axis 44$b$ of the crystal selector passage 74$b$ is disposed in a flat vertical plane 116. The flat vertical plane 116 in which the longitudinal central axis 44$b$ of the crystal selector passage 74$b$ is disposed extends parallel to the planes 99 and 109 (FIGS. 6 and 7) in which the primary and secondary orientation axes of the article to be cast and the seed 104 are disposed.

In the article mold 16$b$, the plane 116 (FIG. 8) is coincident with the planes 99 (FIG. 6) and 110 (FIG. 7) in which the primary and secondary orientation axes for the single crystal article and seed 104 are disposed. Although the planes 99, 109 and 116 are coincident in the illustrated embodiment of the invention, it is contemplated that the article mold 16$b$ could be constructed in such a manner that one or more of the planes would not be coincident with the other planes. However, even if the article mold was constructed so that the planes 99, 109 and 116 are not coincident, the planes would still be parallel.

The single crystal selector 28$b$ has a one-piece ceramic wall, generally designated with the numeral 38$b$ in FIG. 5, which is integrally formed with the starter 30$b$ and article mold 16$b$. The wall 38$b$ is formed in the manner previously explained by covering a disposable crystal selector pattern with ceramic mold material.

The crystal selector 28$b$ (FIG. 5) includes a lower section 40$b$ which extends upwardly from the starter 30$b$. The crystal selector 28$b$ has a single bend section 42$b$ which extends sidewardly and upwardly, first away from and then back toward a vertical central axis of the lower section 40$b$. An upper section 48$b$ extends upwardly from the single bend section 42$b$. The upper section 48$b$ is vertically aligned with the lower section 40$b$ and is connected with the article mold wall 16$b$. The upper section 48$b$ has a vertical axis which is coincident with the vertical axis of the lower section 40$b$.

A support element 54$b$ extends straight upwardly from the lower section 40$b$ to the upper section 48$b$. The vertical support element 54$b$ spans the space between opposite ends of the single bend section 42$b$ to support the single bend section against the influence of vertical and/or sideward loading. The support element 54$b$ is a cylindrical quartz rod. The cylindrical surface of the linear fused quartz rod 54$b$ has been roughened to promote adherence of the ceramic mold material to the quartz rod. In addition, beads or bulges are formed at opposite ends of the support element 54$b$ to promote the adherence of wax pattern material to the support element during forming of the mold structure. If desired, the support element 54$b$ could be made of a material other than fused quartz, for example, a suitable ceramic material.

The crystal selector passage 34b includes a linear, generally cylindrical, lower portion 58b. A lower end of the portion 58b of the selector passage 34b opens into the top of the starter cavity 32b at a location on the vertical central axis of the cylindrical starter cavity. The opposite or upper end of the straight lower portion 58b of the selector passage 34b opens into a single bend portion 62b of the selector passage.

The support element 54b has a vertical central axis 66b which extends parallel to and is offset to one side of the central axis of the lower portion 58b of the selector passage 34b. The support element 54b has a circular cross section with the same diameter as a circular cross section of the lower portion 58b of the selector passage 34b.

The single bend portion 62b of the selector passage 34b has a lower end which opens into the top of the lower portion 58b of the selector passage and an upper end which opens into an upper portion 70b of the selector passage 34b. The single bend portion 62b of the selector passage 34b has an upwardly and outwardly inclined entrance ramp 74b which extends from the lower portion 58b of the selector passage to a single arcuate bend 76b. The entrance ramp 74b is straight and is disposed in a plane containing the vertical central axis of the lower portion 58b of the selector passage and the vertical central axis 66b of the support rod 54b.

The single arcuate bend 76b of the selector passage 34b is formed as a portion of a circle and connects the entrance ramp 74b with a linear exit ramp 78b. The arcuately curving central axis 44b of the single bend 76b of the selector passage 34b is disposed in the same flat plane 116 as the central axis of the entrance ramp 74b, the central axis of the lower section 40b and the central axis 66b of the support rod 54b. The single arcuate bend 76b has a circular cross sectional configuration of the same diameter as the circular cross section of the entrance ramp 74b. However, if desired, the diameter of the selector passage 34b can vary along its entire length.

The upwardly and inwardly inclined exit ramp 78b (FIG. 5) of the selector passage 34b has a lower end which is connected with the single arcuate bend 76b of the selector passage. An upper end of the straight exit ramp 78b of the selector passage 34b is connected with the upper end portion 70b of the selector passage. The exit ramp 78b of the selector passage 34b has a central axis which is disposed in the same flat plane 116 as the central axis of the single bend 76b, entrance ramp 74b and lower portion 58b of the selector passage. The exit ramp 78b of the selector passage 34b has a circular cross sectional configuration of the same diameter as the circular cross section of the arcuate bend 76b.

The linear upper portion 70b of the selector passage 34b has a lower end which opens into the exit ramp 78b of the selector passage 34b. A circular opening at an upper end of the upper portion 70b of the selector passage 34b opens into the article mold cavity 18b. The vertical central axis of the upper portion 70b of the selector passage 34b is disposed in the same flat plane 116 as the central axis of the exit ramp 78b, single arcuate bend 76b, entrance ramp 74b, and lower portion 58b of the selector passage 34b. The vertical central axis of the upper portion 70b of the selector passage 34b is offset to the right (as viewed in FIG. 5) of the vertical axis of the lower portion 58b of the selector passage. The central axis of the upper portion 70b of the selector passage also extends parallel to and is offset to one side of the vertical central axis 66b of the support element 54b.

The vertical central axis 66b of the support element 54b extends parallel to and is offset to one side of the central axis of the upper portion 70b of the selector passage 34b. The vertical axis 66b of the support element 54b is disposed in the plane 116. The support element 54b has a circular cross section with the same diameter as the circular cross section of the upper portion 70b of the selector passage 58b. However, the diameter of the support element 54b could be different than the diameter of the selector passage.

The simplicity of construction of the selector passage 34b is promoted by the fact that the single arcuate bend 76b of the selector passage 34b has a central axis which is disposed in the same flat plane 116 as the central axes of the lower portion 58b and upper portion 70b of the selector passage. In addition, the selector passage 34b has the same circular cross sectional configuration throughout its length. This simplifies tooling for the formation of a mold into which wax pattern material is injected during the forming of the single crystal selector 28b.

The selector passage 34b has a substantially uniform circular cross sectional configuration throughout its length with a diameter of less than 0.25 inches. The single arcuate bend 76b is offset from the central axes 44b and 50b of the lower and upper vertical portions 58b and 70b of the selector passage by a distance which is at least 1.5 times the diameter of the single arcuate bend 76b of the selector passage. Thus, the maximum horizontal distance from the center line of the single arcuate bend 76b to the vertical center line of the upper or lower portion 48b or 40b is at least 1.5 times the diameter of the arcuate bend 76b of the selector passage.

In the illustrated embodiment of the invention, a support element 54b extends downwardly from the crystal selector 28b to the bottom of the starter 30b to enable the support rod 54b to engage the chill plate. The opposite end of the support rod 54b extends into the article mold cavity 18b. This enables the support rod to transmit force from the article mold directly to the chill plate 12b without applying a load to the single crystal selector 28b. However, if desired, the support element 54b could have a lower end portion which is disposed above the starter 30b and an upper end portion which is disposed below the article mold cavity 18b.

It is contemplated that certain embodiments of the crystal selector 28b may not require the support rod 54b. These embodiments of the crystal selector will be constructed so that both the wax pattern of the selector and the selector itself can withstand normal vertical and/or sideward loads.

After the mold structure has been filled with molten metal, the chill plate is slowly lowered and the mold withdrawn from the furnace chamber. Molten metal in the starter cavity 32b solidifies as one or more single crystal grains. A main grain solidifies upwardly from the upper side surface 112 of the single crystal seed 104. This main grain has a vertical primary orientation axis parallel to the selected primary orientation or Z axis (FIG. 6) of the single crystal article to be cast in the article mold cavity 18b. The main grain also has a horizontal secondary orientation axis parallel to the selected secondary orientation or X axis (FIG. 6) of the single crystal article to be cast in the article mold cavity 18b.

In addition to the main grain, one or more secondary single crystal grains may nucleate in the starter cavity 32b. These extra or secondary grains will have a random crystallographic orientation. Therefore, the crystallographic orientation of these secondary grains will probably not correspond to the selected crystallographic orientation of the article to be cast in the mold cavity 18b.

If only one crystal of metal grew in the starter cavity 32b from the seed crystal 104, the crystal selector 28b would not be necessary. However, during production casting operations, it is contemplated that a plurality of crystals will probably grow in the starter cavity 32b on numerous occasions. Therefore, the crystal selector 28b is necessary to be certain that only a crystal having an orientation which corresponds to the selected orientation of the article to be cast in the mold cavity 18b grows into the article mold cavity.

Since the longitudinal central axis 44b of the crystal selector passage 74b is disposed in the plane 116 (FIG. 8) which extends parallel to the plane 99 (FIG. 6) containing the selected primary and secondary orientation axes Z and X, and since at least a portion of the selector passage 74b extends transversely to a vertical axis, only a crystal having a crystallographic orientation corresponding to the selected crystallographic orientation for the article cast in the cavity 18b will be favored for growth in the selector passage 74b. Thus, if the secondary axis of a crystal which nucleates in the starter cavity 32b is parallel to the selected secondary orientation or X axis of the article to be cast in the mold cavity 18b, this crystal will be most favored for growth along the inclined entrance ramp 74b of the selector passage and along the inclined exit ramp 78b of the selector passage. Of course, only a crystal having a primary orientation or Z axis which is vertical will be favored for growth along the selector passage 74b.

Casting Doubly Oriented Single Crystal Article

When the ceramic mold structure is to be used to cast doubly oriented single crystal oriented articles, such as turbine blades, the chill plate is lowered and the mold structure is positioned on the chill plate in the manner previously explained. The chill plate is then raised to position the mold structure in a cylindrical furnace chamber. A housing enclosing the furnace chamber is then evacuated to provide a nonoxidizing atmosphere.

After the furnace chamber has been evacuated, the mold structure is preheated to a temperature above the liquidius temperature of the metal to be cast. Although the preheat temperature will vary depending upon the composition of the metal alloy to be cast, it is contemplated that the preheat temperature may be approximately 1,500° C. A flow of molten metal is then conducted downwardly through the article mold cavity 18b, crystal selector 28b and into the starter cavity 32b. The molten metal in the starter cavity 32b engages the upper side surface 112 of the single crystal seed 104. The single crystal seed 104 and the molten metal have similar compositions.

After the starter cavity 32b has been filled with molten metal, the chill plate is slowly lowered and the mold is withdrawn from the furnace chamber. As the mold is lowered, a single crystal main grain begins to solidify from the upper side surface 112 of the seed 104. This main single crystal grain has a primary orientation or Z axis which is vertical. The main grain or single crystal which grows from the seed 104 will have a secondary orientation or X axis which is horizontal and parallel to the desired secondary orientation or X axis of the article to be cast in the article mold cavity. Thus, the primary and secondary, orientation axes Z and X of the main grain which grows upwardly from the seed 104 will be disposed in a vertical plane which extends parallel to the plane 100 (FIG. 6) containing the primary and secondary orientation axes of the single crystal article to be cast.

In addition, one or more secondary single crystal grains may nucleate in the starter cavity 32b. These grains or single crystals may have a vertical primary orientation or Z axis. However, the secondary orientation or X axes of these grains will probably be skewed relative to the selected secondary orientation or X axis of the article to be cast in the mold cavity 18b.

If a secondary crystal is allowed to grow into the article mold cavity 18b, the resulting article will probably not have the desired crystallographic orientation. Therefore, the orientation of the single crystal selector 28b is such as to promote the growth of only the main grain or single crystal which has a crystallographic orientation corresponding to the selected crystallographic orientation of the article to be cast in the mold cavity 18b. The crystal selector 28b will retard the growth of the other or secondary grains which do not have a crystallographic orientation corresponding to the desired crystallographic orientation for the article to be cast in the mold cavity 18b.

As the mold structure is gradually withdrawn from the furnace chamber, a plurality of grains, that is the main grain and one or more secondary grains, grow from the starter cavity 32b into the lower portion 58b of the selector passage 74b. As the molten metal solidifies in the lower portion 58b of the selector passage 34b, the grains which are most favorably oriented for vertical growth tend to crowd out the grains which are less favorably oriented. It is possible that the main grain and one or more of the secondary grains will all have vertical primary orientations or Z axes and will all be favorably oriented for vertical growth.

Continued solidification of the molten metal in the crystal selector passage 34b results in the grains growing upwardly and horizontally sidewardly along the inclined entrance ramp 74b of the crystal selector passage 34b. Since the longitudinal central axis 44b of the crystal selector passage 34b is disposed in the plane 116, only the grains having secondary orientations or X axes disposed in the plane 116 will be favored for sideward growth along the transversely extending entrance ramp 74b of the crystal selector passage 34b. Therefore, these grains will tend to crowd out the other or secondary grains having secondary orientation or X axes which are skewed relative to the plane 116. Therefore, as the molten metal solidifies in the arcuate bend portion 76b of the selector passage 34b, the most favorably oriented grain will probably crowd out or will have crowded out any other grain or grains. This most favorably oriented grain will have primary and secondary orientations or Z and X axes parallel to the selected primary and secondary orientations or Z and X axes of the article to be cast in the mold cavity 18b.

As the solidification of the molten metal continues from the arcuate bend 76b of the selector passage 34b into the upwardly and rightwardly (as viewed in FIG. 5) sloping exit ramp 78b of the selector passage, the crystal or crystals will grow upwardly and sidewardly. Since the longitudinal central axis of the exit ramp 78b is disposed in the plane 116, the main crystal having a crystallographic orientation which corresponds to the crystallographic orientation of the seed 104 will be most favored for growth. This is because both the primary and secondary or Z and X orientation axes of the main grain will be disposed in the plane 116. Therefore, if an additional grain somehow manages to grow into the exit ramp 78b, the most favorably oriented main grain will crowd out the less favorably oriented secondary grain.

Finally, the molten metal in the vertical upper portion 70b of the selector passage 34b will solidify as the main crystal continues to grow. The main crystal will grow into the article mold cavity 18b. Since the main crystal which grows from the exit ramp 78b to the vertical portion 70b of the selector passage 34b will have a crystallographic orientation corresponding to the crystallographic orientation of the seed 104 and the selected crystallographic orientation of the article to be cast in the mold cavity 18b, the molten metal in the mold cavity 18b will solidify as a single crystal having selected primary and secondary orientations.

Starter or Doubly Oriented Single Crystal Article

Second Embodiment

Figure 10:
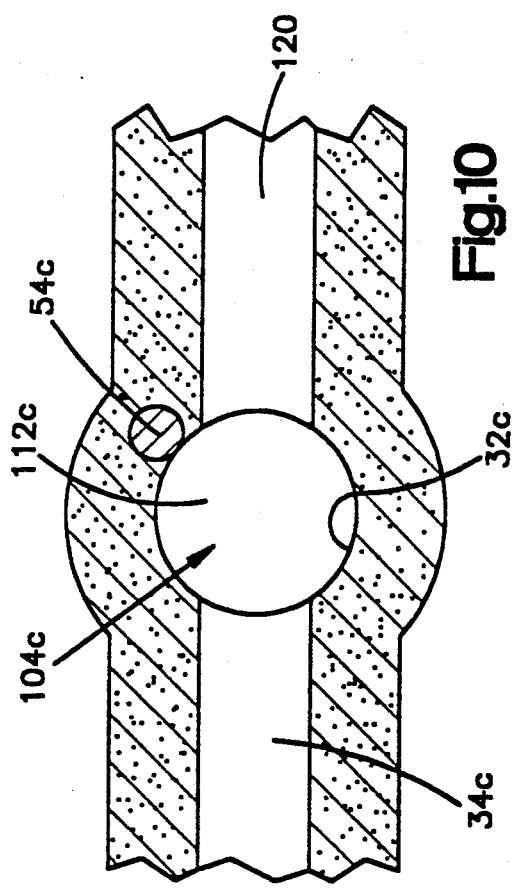
FIG. 10 (on sheet 5 of the drawings) is a sectional view, taken generally along the line 10—10 of FIG. 9, illustrating the relationship between an entrance ramp portion of a selector passage in the single crystal selector, the seed crystal, and a contaminant receiving chamber offset to one side of the seed crystal.
Figure 9:
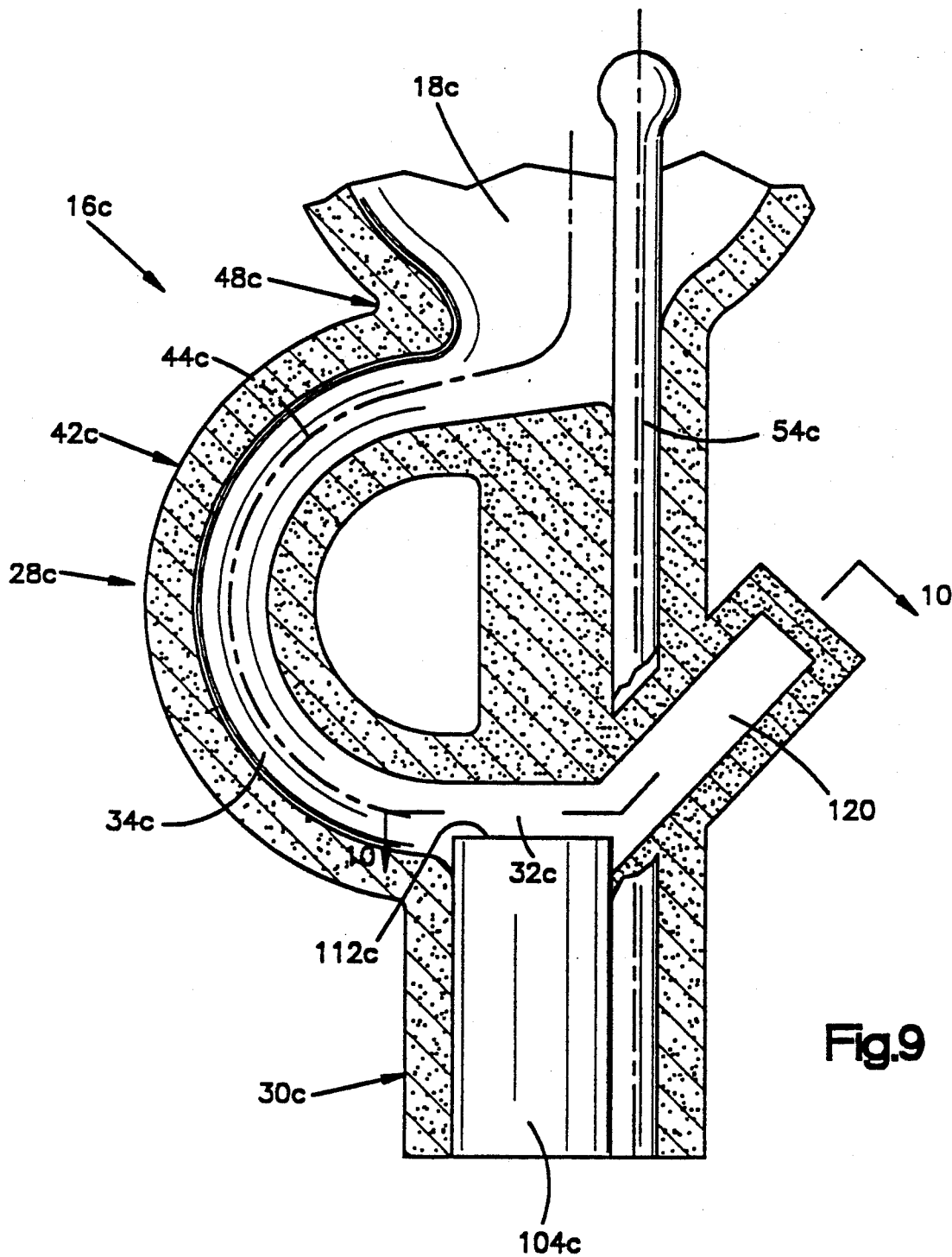
FIG. 9 is an enlarged sectional view, generally similar to FIG. 5, of a second embodiment of a single crystal selector to be used with a seed crystal to cast a single crystal article having selected primary and secondary orientations.

In the embodiment of the invention illustrated in FIGS. 5-8, the single crystal selector 28b has a selector passage 34b with linear entrance and exit ramps 74b and 78b leading to and from a single arcuate bend 62b. In the embodiment of the invention illustrated in FIGS. 9 and 10, the crystal selector has the same construction as the crystal selector 28a of FIG. 4. Therefore, the selector passage has a single continuously curving arcuate bend which interconnects upper and lower portions of the selector passage. In addition, in the embodiment of the invention illustrated in FIGS. 9 and 10, provision is made to remove contaminants from the upper end portion of the single crystal seed. Since the embodiment of the invention illustrated in FIGS. 9 and 10 is generally similar to the embodiment of the invention illustrated in FIGS. 5-8, similar numerals will be utilized to designate similar components, the suffix letter "c" being associated with the components of the embodiment of the invention shown in FIGS. 9 and 10 to avoid confusion.

The single crystal selector 28c has a single bend section 42c which extends sidewardly and upwardly away from a starter 30c and then back toward a vertical central axis of the starter 30c. A vertical section 48c extends upwardly from the single bend section 42c and is connected with an article mold cavity 18c. The crystal selector passage 34c has a longitudinal central axis 44c which is disposed in a single flat plane, corresponding to the plane 116 of FIG. 8. The plane in which the longitudinal central axis 44c of the crystal selector passage 34c is disposed extends parallel to a plane containing selected primary and secondary orientations or Z and X axes of a single crystal article to be cast in the article mold cavity 18c.

The selector passage 34c has a lower end portion which is connected with a starter cavity 32c. Thus, the selector passage 34c opens into a vertically extending side of the cylindrical selector cavity 32c. A cylindrical single crystal seed 104c is disposed in the starter cavity 32c. It should be noted that in the embodiment of the invention illustrated in FIG. 9, the ceramic mold material of the article mold 16c directly engages the single crystal seed 104c and that the holder or retainer 106 has been eliminated. Therefore, the ceramic mold material forms a retainer which holds the seed 104c in the desired crystallographic orientation which corresponds to the selected crystallographic orientation of an article to be cast in the mold cavity 18c.

The single crystal seed 104c has a crystallographic orientation such that the primary and secondary orientation or Z and X axes are disposed in a vertical plane which extends parallel to the vertical plane containing the longitudinal central axis 44c of the crystal selector 28c and to a plane containing the selected primary and secondary orientation or Z and X axes of the article to be cast in the mold cavity 18c. Therefore, the crystal selector 28c promotes the growth of only a main grain having a crystallographic orientation which corresponds to the desired or selected crystallographic orientation of the article to be cast and to the seed 104c.

In accordance with a feature of this embodiment of the invention, a closed-ended contaminant receiving chamber 120 (FIGS. 9 and 10) is provided to receive contaminants which are washed from the upper side surface 112c of the single crystal seed 104c by a flow of molten metal into the starter cavity 32c. To promote a smooth continuous flow of molten metal across the upper side surface 112c of the single crystal seed 104c, the contaminant receiving cavity 120 is disposed diametrically opposite from the selector passage entrance to the starter cavity 32c (FIG. 10). Therefore, when molten metal is poured into the article mold 16c, there is a smooth continuous flow of molten metal across the upper side surface of the single crystal seed 104c to wash away any contaminants which may be on the upper side surface 112c of the single crystal seed. By eliminating contaminants in this manner, the tendency for an excessive number of crystals to nucleate in the starter cavity 32c is reduced.

Figure 11:
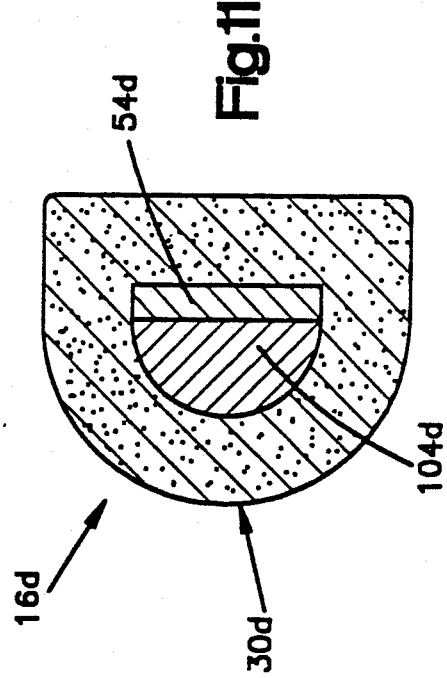
FIG. 11 is a schematic sectional view of a third embodiment of the invention illustrating the relationship between a seed crystal and a support element.

In the embodiment of the invention illustrated in FIGS. 5-10, a support rod or element 54b or 54c and the single crystal seed 104b and 104c both have a generally cylindrical configuration. However, it is contemplated that both the support rod and the single crystal seed could have different configurations if desired. Thus, in the embodiment of the invention illustrated in FIG. 11, the single crystal seed and support rod have noncircular cross sectional configurations. Since the embodiment of the invention illustrated in FIG. 11 is generally similar to the embodiment of the invention illustrated in FIGS. 5-10, similar numerals will be utilized to designate similar components, the suffix letter "d" be associated with the numerals of FIG. 11 to avoid confusion.

The article mold 16d has a starter 30d in which a single crystal seed 104d is disposed. A support element or rod 54d is provided to support a crystal selector in the manner illustrated in FIG. 5 for the crystal selector 28b.

In accordance with a feature of this embodiment of the invention, the single crystal seed 104d has noncylindrical configuration. Thus, the single crystal seed 104d is semi-circular in cross sectional configuration. By forming the single crystal seed 104d with a noncircular cross sectional configuration, positioning of the seed with the primary and secondary crystallographic orientations of the seed in positions which are parallel to the selected primary and secondary crystallographic orientation for an article to be cast is facilitated. In addition, the support element or rod 54d has a noncircular cross sectional configuration and is disposed in flat abutting engagement with a side surface of the seed 104d. This enables the support element or rod 54d to be positioned along with the seed relative to the article mold 16d.

CONCLUSION

A mold 16b (FIG. 5) constructed in accordance with the present invention is used to cast a single crystal article having selected primary and secondary orientations. The mold 16b has an improved crystal selector 28b which promotes the emergence of a single crystal having the desired crystallographic orientation from a selector passage 74b into an article mold cavity 18b. The selector 28b has a relatively simple construction which tends to minimize tooling costs. In addition, the simple construction of the selector 28b minimizes the amount of relatively expensive metal which is used in the selector.

The improved crystal selector 28b is used in conjunction with a single crystal seed 104 which is disposed in a starter cavity 32b and has primary and secondary orientation or Z and X axes (FIG. 7) parallel to selected primary and secondary orientation or Z and X axes (FIG. 6) of the single crystal article. Although it is desired to initiate the solidification of only a single crystal of metal from a surface 112 of a single crystal seed 104 during a casting operation, a plurality of crystals may be nucleated in the starter cavity 32b, particularly during production casting operations. Among the plurality of crystals will be a main crystal which is formed from the surface 112 of the single crystal seed 104 with primary and secondary orientation axes parallel to the selected primary and secondary orientation axes of the single crystal article to be cast. Unwanted additional or secondary crystals which are nucleated in the starter cavity 32b may have a random crystallographic orientation. In all probability, the random crystallographic orientation of these unwanted crystals will differ from the selected crystallographic orientation of the article to be cast.

To enable only the main crystal having the desired crystallographic orientation to grow from the starter cavity 32b to the article mold cavity 18b, an improved crystal selector 28 is used in combination with the seed crystal 104. The crystal selector 28b has a selector passage 74b with a longitudinal axis 44b which extends transversely to a vertical central axis of the starter cavity 32b for at least a portion of the passage 74b. The longitudinal axis 44b of the selector passage is disposed in a single plane 116 which is parallel to both the selected primary orientation or Z axis (FIG. 6) of the single crystal article and the selected secondary orientation or X axis (FIG. 6) of the single crystal article. Therefore, the single crystal selector passage 74b is constructed in such a manner as to promote the growth of only a crystal which has a crystallographic orientation corresponding to the selected crystallographic orientation of the article to be cast.

Having described a specific preferred embodiment of the invention, the following is claimed:

1. A mold for use in casting an article as a single crystal having selected primary and secondary orientations, said mold comprising article mold means for defining an article mold cavity having a configuration corresponding to the configuration of the article to be cast, starter means for defining a starter cavity in which molten metal solidifies as one or more crystals, said starter means including means for holding a single crystal seed with a primary orientation axis parallel to the selected primary orientation axis of the single crystal article and a secondary orientation axis parallel to the selected secondary orientation axis of the single crystal article when the single crystal article is cast in the mold cavity, and selector means extending between an upper portion of said starter means and a lower portion of said article mold means for at least partially defining a crystal selector passage which extends between said starter cavity and said article mold cavity and from which a single crystal of metal having a primary orientation and a secondary orientation which correspond to the selected primary and secondary orientations of the single crystal article solidifies upwardly into said article mold cavity, said selector means includes a lower section connected with said starter means and in which a lower portion of said selector passage extends upwardly away from an upper end portion of said starter cavity, an upper section connected with said article mold means and in which an upper portion of said selector passage extends downwardly away from a lower end portion of said article mold cavity, a single arcuate bend section connected with said upper and lower sections and in which a single arcuate bend portion of said selector passage extends between an upper end of the lower portion of said selector passage and a lower end of the upper portion of said selector passage, said upper and lower portions and said single arcuate bend portion of said crystal selector passage having a longitudinal central axis at least a portion of which extends transversely to a vertical central axis of the starter cavity, said longitudinal central axis of said upper and lower portions and said single arcuate bend portion of said selector passage being disposed in a single vertical plane which is parallel to a plane containing the selected primary orientation axis of the single crystal article and the selected secondary orientation axis of the single crystal article when the single crystal article is cast in said article mold cavity.

2. A mold as set forth in claim 1 wherein a vertical central axis of said article mold cavity is disposed in the same plane as the longitudinal central axis of said selector passage.

3. A mold as set forth in claim 2 wherein a vertical central axis of said starter cavity is disposed in the same plane as the longitudinal central axis of said selector passage.

4. A mold as set forth in claim 3 wherein the vertical central axis of the article mold cavity is offset to one side of the vertical central axis of said starter cavity.

5. A mold as set forth in claim 1 further including a support element which extends upwardly from a location alongside the single crystal seed to an upper portion of said selector means to at least partially support said selector means.

6. A mold as set forth in claim 5 wherein said starter means includes a seed holder and ceramic mold material extending around said seed holder, said support element being disposed in abutting engagement with said seed holder.

7. A mold as set forth in claim 5 wherein said support element is disposed in abutting engagement with the single crystal seed.

8. A mold as set forth in claim 1 wherein a portion of said crystal selector passage is connected to said starter means and extends transversely to the vertical central axis of said starter cavity at an interconnection between said selector means and said starter means, said means for holding a single crystal seed holding the single crystal seed with a portion of the single crystal seed disposed above a portion of said interconnection between said selector means and said starter means to enable molten metal flow across an upper side of the single crystal seed during filling of the starter cavity with molten metal.

9. A mold as set forth in claim 1 further including a closed-ended contaminant receiving chamber connected in fluid communication with the starter cavity to receive contaminants during filling of the starter cavity with molten metal.

10. A mold as set forth in claim 1 wherein said starter means includes a rigid seed holder, said mold further including a support element which is connected with said rigid seed holder and extends upwardly from said rigid seed holder to at least partially support said selector means.

11. A mold for use in casting a single crystal metal article having selected primary and secondary orientations, said mold comprising article mold means for defining an article mold cavity having a configuration corresponding to the configuration of the article to be cast, starter means for defining a starter cavity in which molten metal may solidify as one or more metal crystals, said starter means including surface means for holding a single crystal seed with a primary orientation axis and a secondary orientation axis parallel to the selected primary and secondary orientation axes of the single crystal article, and selector means extending between an upper portion of said starter means and a lower portion of said article mold means for at least partially defining a crystal selector passage which extends between said starter cavity and said article mold cavity and from which a single crystal of metal solidifies upwardly into said article mold cavity, said selector means including a lower section connected with said starter means and in which a lower portion of said selector passage extends upwardly away from an upper end portion of said starter cavity, an upper section connected with said article mold means and in which an upper portion of said selector passage extends downwardly away from a lower end portion of said article mold cavity, and a single bend section connected with said upper and lower sections and in which a single bend portion of said selector passage extends between an upper end of the lower portion of said selector passage and a lower end of the upper portion of said selector passage, said single bend portion of said selector passage having a single arcuate bend and a longitudinal central axis which intersects central axes of said upper and lower portions of said selector passage, said longitudinal central axis of said single bend portion of said selector passage and the central axes of said upper and lower portions of said selector passage being disposed in a single flat plane.

12. A mold as set forth in claim 11 further including a support element which extends upwardly from said lower section to said upper section of said selector means to at least partially support said bend section of said selector means, said single bend portion of said selector passage being spaced from said support element at locations other than at opposite ends of said single bend portion of said selector passage.

13. A mold as set forth in claim 11 wherein the horizontal distance between the central axes of said upper and lower portions of said selector passage and a furthest point on the longitudinal central axis of the single arcuate bend in said single bend portion of said selector passage is at least as great as 1.5 times the thickness of the selector passage at the single arcuate bend.

14. A mold as set forth in claim 11 wherein said selector passage has a generally circular cross sectional configuration with a diameter which is less than 0.25 inches.

15. A mold as set forth in claim 11 further including a support element which extends upwardly from said lower section to said upper section of said selector means to at least partially support said bend section of said selector means, opposite ends of said single bend portion of said selector passage being vertically spaced apart and said support element spanning the space between the opposite ends of said single bend portion of said selector passage.

16. A mold as set forth in claim 11 further including a support element which at least partially supports said bend section of said selector means and has a vertical central axis which is offset to one side of the central axes of said upper and lower portions of said selector passage and is disposed in the same flat plane as the longitudinal central axis of said single bend portion of said selector passage and the central axes of said upper and lower portions of said selector passage.

17. A mold as set forth in claim 11 further including a support element which at least partially supports said bend section of said selector means and is disposed adjacent to a side of said upper and lower portions of said selector passage opposite from said single bend portion of said selector passage.

18. A mold as set forth in claim 11 further including a support element which at least partially supports said bend section of said selector means, an upper end portion of said support element being engaged by said article mold means and a lower end portion of said support element being engaged by said starter means.

19. A mold as set forth in claim 11 wherein said selector passage has a longitudinal central axis which is disposed in a single plane which is parallel to a plane containing the selected primary orientation axis of the single crystal article and the selected secondary orientation axis of the single crystal article when the single crystal article is cast in said article mold cavity.

20. A mold as set forth in claim 11 wherein the single flat plane in which the longitudinal central axis of said single bend portion of said selector passage and the central axes of said upper and lower portions of said selector passage are disposed is parallel to a single flat plane in which the selected primary and secondary orientation axes of the single crystal article are disposed when the single crystal article is cast in said article mold cavity.

21. A method of casting an article as a single crystal, said method comprising the steps of conducting a flow of molten metal through an article mold cavity to a starter cavity containing a single crystal seed, thereafter, removing contaminants from the upper side surface of the single crystal seed by conducting an initial portion of the flow of molten metal from the article mold cavity across an upper side surface of the single crystal seed, said step of conducting an initial portion of the flow of molten metal from the article mold cavity across the upper side surface of the single crystal seed including conducting the flow of molten metal across the upper side surface of the single crystal seed from one edge portion of the seed to the opposite edge portion of the seed in a stream having a direction of flow which is generally parallel to the upper side surface of the single crystal seed throughout the extent of the upper side surface of the single crystal seed, and removing the contaminants from the starter cavity by conducting the initial portion of the flow of molten metal to a contaminant receiving chamber which is spaced from the mold cavity.

22. A method as set forth in claim 21 wherein said steps of conducting the initial portion of the flow of molten metal from the article mold cavity across an upper side surface of the single crystal seed includes a conducting a single continuous stream of molten metal across the upper side surface of the single crystal seed.

23. A method as set forth in claim 22 wherein said steps of conducting the initial portion of the flow of molten metal from the article mold cavity across an upper side surface of the single crystal seed includes conducting the initial portion of the flow of molten metal through a first opening disposed adjacent a first side of the single crystal seed and conducting the initial portion of the flow of molten metal through a second opening disposed adjacent a second side of the single crystal seed opposite from the first side of the single crystal seed.

24. A method as set forth in claim 22 wherein said step of conducting the flow of molten metal from the article mold includes conducting the molten metal from the article mold cavity along a nonlinear passage having a longitudinal axis disposed in a plane which is parallel to a selected primary orientation axis of the single crystal article and a selected secondary orientation axis of the single crystal article when the single crystal article is cast in the article mold cavity.

* * * * *

UNITED STATES PATENT AND TRADEMARK OFFICE
CERTIFICATE OF CORRECTION

PATENT NO. : 5,062,469

DATED : November 5, 1991

INVENTOR(S) : Louis H. Monte, et al.

It is certified that error appears in the above-identified patent and that said Letters Patent is hereby corrected as shown below:

Column 25, Line 10, Claim 23, change "22" to --21--.

Column 26, Line 6, Claim 24, change "22" to --21--.

Signed and Sealed this

Ninth Day of March, 1993

*Attest:*

STEPHEN G. KUNIN

*Attesting Officer*     Acting Commissioner of Patents and Trademarks